(12) United States Patent
Matsuda et al.

(10) Patent No.: US 7,768,354 B2
(45) Date of Patent: Aug. 3, 2010

(54) RADIO-FREQUENCY POWER AMPLIFIER

(75) Inventors: Shingo Matsuda, Kyoto (JP); Hirokazu Makihara, Osaka (JP); Kazuki Tateoka, Kyoto (JP); Masahiko Inamori, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/399,452

(22) Filed: Mar. 6, 2009

(65) Prior Publication Data
US 2009/0251220 A1    Oct. 8, 2009

(30) Foreign Application Priority Data
Apr. 8, 2008    (JP)    ............... 2008-100299

(51) Int. Cl.
*H03F 3/04*    (2006.01)
(52) U.S. Cl. ..................... 330/299; 330/289
(58) Field of Classification Search .............. 330/299, 330/289, 285, 296
See application file for complete search history.

(56) References Cited

U.S. PATENT DOCUMENTS

| | | | |
|---|---|---|---|
| 6,448,859 B2 | 9/2002 | Morizuka | |
| 6,750,718 B2 | 6/2004 | Moriwaki et al. | |
| 6,946,913 B2 | 9/2005 | Moriwaki et al. | |
| 7,012,469 B2 | 3/2006 | Moriwaki et al. | |
| 7,019,508 B2 | 3/2006 | Rategh et al. | |
| 7,088,183 B2 * | 8/2006 | Kuriyama | 330/296 |
| 7,154,336 B2 * | 12/2006 | Maeda | 330/285 |

* cited by examiner

*Primary Examiner*—Henry K Choe
(74) *Attorney, Agent, or Firm*—McDermott Will & Emery LLP

(57) ABSTRACT

A bias circuit operable to supply a bias current to a first transistor includes: a second transistor having a collector terminal connected to a first power supply; a first resistance element having one end connected to an emitter terminal of the second transistor and having the other end connected to a base terminal of the first transistor; a second resistance element having one end connected to the emitter terminal of the second transistor and having the other end connected to ground potential; at least one third resistance element provided between a base terminal of the second transistor and a second power supply; and a plurality of temperature compensation circuits connected to the base terminal of the second transistor which are operable to control a base potential of the second transistor so that the potential falls as a temperature rises.

7 Claims, 9 Drawing Sheets

RADIO-FREQUENCY POWER AMPLIFIER

BACKGROUND OF THE INVENTION

1. Field of the Invention

The present invention relates to a radio-frequency power amplifier, and particularly to a radio-frequency power amplifier of which a bias circuit for supplying a bias current to the amplifying transistor includes a plurality of temperature compensation circuits.

2. Description of the Background Art

In recent years, due to the installation of various application functions in a mobile communication device such as a mobile phone, the number of components of the mobile phone tends to increase in accordance with the number of necessary components to control these functions. On the other hand, the mobile phone is miniaturized, and accordingly, it is necessary to miniaturize the components so as to increase the degree of integration of each component. However, some of the components may produce heat, and the higher the degree of integration of each component is made by miniaturizing the components, the more difficult it becomes to maintain a constant temperature in the mobile phone. Therefore, the components of the mobile phone are required to be stable with respect to temperature dependence.

In these circumstances, as a radio-frequency power amplifier, one of the components of the mobile phone, which amplifies the power of a radio-frequency transmitted signal, an HEMT (High Electron Mobility Transistor), which is stable toward temperature dependence, is used. However, this requires separately a negative voltage generator so as to control the gate voltage, and therefore hinders the miniaturization and the cost reduction of the mobile phone. As a result, conventionally, an HBT (Heterojunction Bipolar Transistor), which is used with a single power supply, is mostly used as a radio-frequency power amplifier. The bias circuit of a radio-frequency power amplifier using an HBT includes a temperature compensation circuit for compensating for the temperature characteristics of the diffusion potential between the base and emitter.

FIG. 8 is a diagram showing the circuit configuration of a radio-frequency power amplifier using an HBT, disclosed in Patent Document 1. The radio-frequency power amplifier of FIG. 8 includes an amplifying transistor Tr1 and a bias circuit.

The amplifying transistor Tr1 power-amplifies a radio-frequency signal inputted from an input terminal Pin and outputs the power-amplified radio-frequency signal from an output terminal Pout. The collector terminal of the amplifying transistor Tr1 is connected to a power supply Vcc, and the emitter terminal is connected to ground potential.

The bias circuit, which supplies a bias current to the base terminal of the amplifying transistor Tr1, includes an emitter-follower transistor Tr2, a transistor Tr8, a resistance element R1, a resistance element R13, a resistance element R14, a capacitor C1, and a temperature compensation circuit 15. The collector terminal of the emitter-follower transistor Tr2, which is an emitter follower, is connected to a power supply Vdc, and the base terminal is connected to the temperature compensation circuit 15, surrounded by a dashed line, to one end of the resistance element R13, and to one end of the capacitor C1. The other end of the resistance element R13 is connected to a reference power supply Vref, and the other end of the capacitor C1 is connected to ground potential. The emitter terminal of the emitter-follower transistor Tr2 is connected to the base terminal of the amplifying transistor Tr1 via the resistance element R1 and also connected to the collector terminal of the transistor Tr8. The collector terminal and base terminal of the transistor Tr8 are connected to each other via the resistance element R14. The emitter terminal of the transistor Tr8 is connected to ground potential.

The temperature compensation circuit 15 includes a transistor Tr9, a transistor Tr10, and a resistance element R15. The collector terminal of the transistor Tr9 is connected to a power supply Vdc, and the base terminal is connected to the base terminal of the emitter-follower transistor Tr2 and the collector terminal of the transistor Tr10. The emitter terminal of the transistor Tr9 is connected to the base terminal of the transistor Tr10 and connected to ground potential via the resistance element R15. The emitter terminal of the transistor Tr10 is connected to ground potential.

The operating principle of the temperature compensation circuit 15 will be described. At low temperature, the diffusion potential between the base and emitter of the transistor Tr9 rises. When the diffusion potential rises, the current (hereinafter referred to as "collector current") between the collector and emitter of the transistor Tr9 decreases, and therefore the potential of the terminal, connected to the emitter terminal of the transistor Tr9, of the resistance element R15 falls and the base potential of the transistor Tr10 also falls. When the base potential of the transistor Tr10 falls, the collector current of the transistor Tr10 decreases, and therefore the current flowing through the resistance element R13 decreases. When the current flowing through the resistance element R13 decreases, the potential difference, i.e., the voltage, caused in the resistance element R13 decreases, and therefore the base potential of the emitter-follower transistor Tr2 rises. When the base potential rises, the collector current of the emitter-follower transistor Tr2 increases, and therefore the base potential of the amplifying transistor Tr1 rises. This compensates for the idle current of the amplifying transistor Tr1 so that the value of the idle current increases. In contrast, at high temperature, the reverse operation to that performed at low temperature is performed. In this case, the base potential of the emitter-follower transistor Tr2 falls, and therefore the idle current of the amplifying transistor Tr1 is compensated for so that the value of the idle current decreases.

Here, there may be a case where a portion of the power of the transmitted signal from the amplifying transistor Tr1 leaks to the bias circuit via the emitter-follower transistor Tr2. As a result, the base potential of the emitter-follower transistor Tr2 may become so unstable that it is impossible to supply a stable bias current.

In the configuration of FIG. 8, to solve this problem, the capacitor C1 is connected to the base terminal of the emitter-follower transistor Tr2. However, in such a system as GSM (Global System for Mobile Communications) that uses a large transmitted signal, it is necessary to use the capacitor C1 that has a considerably large capacitance, which significantly increases the size of the capacitor C1. On the other hand, in view of the miniaturization of the mobile phone, there are limitations to increasing the size of the capacitor C1. Therefore, with the configuration of FIG. 8, it is difficult to supply a stable bias current.

In response, a radio-frequency power amplifier disclosed in Patent Document 2 is proposed. FIG. 9 is a diagram showing the circuit configuration of the radio-frequency power amplifier disclosed in Patent Document 2. The radio-frequency power amplifier of FIG. 9 includes an amplifying transistor Tr1 and a bias circuit. Note that, in FIG. 9, the same components as those of FIG. 8 will be denoted by the same numerals and will not be described.

The bias circuit, which supplies a bias current to the base terminal of the amplifying transistor Tr1, includes an emitter-follower transistor Tr2, resistance elements R1, R2 and R3, and a temperature compensation circuit 11. The base terminal of the emitter-follower transistor Tr2 is connected to the temperature compensation circuit 11, surrounded by a dashed line, and to one end of the resistance element R2. The other end of the resistance element R2 is connected to a reference power supply Vref. The emitter terminal of the emitter-follower transistor Tr2 is connected to the base terminal of the amplifying transistor Tr1 via the resistance element R1 and also connected to one end of the resistance element R3. The other end of the resistance element R3 is connected to ground potential.

The temperature compensation circuit 11 includes a diode transistor Tr3, the base terminal and collector terminal of which are short-circuited and a diode transistor Tr4, the base terminal and collector terminal of which are short-circuited. The diode transistors Tr3 and Tr4 are connected to each other as two stages in cascade. The emitter terminal of the diode transistor Tr4, which is the lower stage, is connected to ground potential, and the collector terminal of the diode transistor Tr3, which is the upper stage, is connected to the base terminal of the emitter-follower transistor Tr2 and also connected to the reference power supply Vref via the resistance element R2.

The operating principle of the temperature compensation circuit 11 will be described. The diffusion potential between the base of the diode transistor Tr3 and the emitter of the diode transistor Tr4 changes with temperature change, whereby the collector potential of the diode transistor Tr3 (i.e., the base potential of the emitter-follower transistor Tr2) also changes with temperature change. Specifically, at low temperature, the diffusion potential between the base and emitter of the diode transistor Tr3 rises. When the diffusion potential rises, the collector current of the diode transistor Tr3 decreases, and therefore the current flowing through the resistance element R2 decreases. When the current flowing through the resistance element R2 decreases, the voltage caused in the resistance element R2 decreases, and therefore the base potential of the emitter-follower transistor Tr2 rises. When the base potential rises, the collector current of the emitter-follower transistor Tr2 increases, and therefore the base potential of the amplifying transistor Tr1 rises. This compensates for the idle current of the amplifying transistor Tr1 so that the value of the idle current increases. In contrast, at high temperature, the reverse operation to that performed at low temperature is performed. In this case, the base potential of the emitter-follower transistor Tr2 falls, and therefore the idle current of the amplifying transistor Tr1 is compensated for so that the value of the idle current decreases.

The use of the temperature compensation circuit 11 described above suppresses the leakage power of the transmitted signal from the amplifying transistor Tr1, due to the parasitic capacitance between the base of the diode transistor Tr3 and the emitter of the diode transistor Tr4. Therefore, with the configuration of FIG. 9, it is possible, unlike the configuration of FIG. 8, to smooth the base potential of the emitter-follower transistor Tr2 without using a large-size capacitor C1 besides the temperature compensation circuit, and therefore to supply a stable bias current.

Patent Document 1: Japanese Laid-Open Patent Publication No. 2005-101733

Patent Document 2: Japanese Laid-Open Patent Publication No. 2001-274636

However, with the radio-frequency power amplifier of FIG. 9, it is impossible to sufficiently suppress the temperature dependence of the idle current of the amplifying transistor Tr1, due to the circuit configuration of the temperature compensation circuit 11, and therefore it is impossible to sufficiently compensate for temperature.

To sufficiently compensate for temperature in the radio-frequency power amplifier of FIG. 9, it is necessary to make the voltage value of the reference power supply Vref far greater than twice the diffusion potential between the base of the transistor Tr3 and the emitter of the transistor Tr4. Additionally, to prevent the idle current of the amplifying transistor Tr1 from significantly increasing, it is also necessary to increase the resistance value of the resistance element R2. However, when the resistance value of the resistance element R2 is increased, the voltage caused in the resistance element R2 increases when the operating current of the amplifying transistor Tr1 increases due to a large signal. As a result, the power gain falls, which hinders high efficiency. Consequently, with the radio-frequency power amplifier of FIG. 9, there are limitations to increasing the resistance value of the resistance element R2, and therefore it is difficult to sufficiently compensate for temperature.

SUMMARY OF THE INVENTION

Therefore, to solve the above problem, an object of the present invention is to provide a radio-frequency power amplifier having a bias circuit capable of making the temperature dependence, of the idle current of an amplifying transistor, lower than is conventionally the case and thus sufficiently compensating for temperature.

The present invention is directed to solving the above problem. A radio-frequency power amplifier according to the present invention includes: a first transistor operable to amplify a power of a radio-frequency signal; and a bias circuit operable to supply a bias current to the first transistor. The bias circuit includes: a second transistor that has a collector terminal connected to a first power supply; a first resistance element that has one end connected to an emitter terminal of the second transistor and has the other end connected to a base terminal of the first transistor; a second resistance element that has one end connected to the emitter terminal of the second transistor and has the other end connected to ground potential; at least one third resistance element provided between a base terminal of the second transistor and a second power supply; and a plurality of temperature compensation circuits connected to the base terminal of the second transistor which are operable to control a base potential of the second transistor so that the potential falls as a temperature rises.

Note that, in an embodiment described below, for example, the first transistor corresponds to an amplifying transistor Tr1, the first power supply corresponds to a power supply Vdc, the second transistor corresponds to an emitter-follower transistor Tr2, the first resistance element corresponds to a resistance element R1, the second resistance element corresponds to a resistance element R3, the second power supply corresponds to a reference power supply Vref, and the third resistance element corresponds to a resistance element R2.

Based on the configuration described above, the bias circuit includes the plurality of temperature compensation circuits. This makes it possible to make the temperature dependence, of the idle current of the first transistor, lower than is conventionally the case. As a result, based on the present embodiment, it is possible to provide a radio-frequency power amplifier having a bias circuit capable of sufficiently compensating for temperature.

It is preferable that the bias circuit may include a first temperature compensation circuit and a second temperature compensation circuit, that the first temperature compensation circuit may include: a third transistor that has a collector terminal and a base terminal that are short-circuited, the collector terminal being connected to the base terminal of the second transistor; and a fourth transistor that has a collector terminal and a base terminal that are short-circuited, the collector terminal being connected to an emitter terminal of the third transistor, and has an emitter terminal connected to ground potential, and that the second temperature compensation circuit may include: a first voltage divider circuit having a plurality of series resistance elements connected in series; a fifth transistor that has a collector terminal connected to the base terminal of the second transistor and an emitter terminal connected to ground potential; and a fourth resistance element that has one end connected to a connecting point of any of the series resistance elements of the first voltage divider circuit and has the other end connected to a base terminal of the fifth transistor.

Note that, in an embodiment described below, for example, the first temperature compensation circuit corresponds to a temperature compensation circuit 11, the second temperature compensation circuit corresponds to a temperature compensation circuit 12, a third transistor corresponds to a diode transistor Tr3, the fourth transistor corresponds to a diode transistor Tr4, the series resistance elements correspond to a resistance element R4 and a resistance element R5, the fifth transistor corresponds to a transistor Tr5, and the fourth resistance element corresponds to a resistance element R6.

In this case, the bias circuit may further include at least one sixth resistance element provided between the base terminal of the second transistor and a connecting point of the third resistance element and the collector terminal of the fifth transistor. Note that, in the embodiments described below, for example, the sixth resistance element corresponds to a resistance element R12.

The bias circuit may further include a third temperature compensation circuit, and the third temperature compensation circuit may include: a second voltage divider circuit having a plurality of series resistance elements connected in series; a sixth transistor that has a collector terminal connected to the base terminal of the second transistor and has an emitter terminal connected to ground potential; and a fifth resistance element that has one end connected to a connecting point of any of the series resistance elements of the second voltage divider circuit and has the other end connected to a base terminal of the sixth transistor, and resistance values of the series resistance elements of the first voltage divider circuit, the series resistance elements of the second voltage divider circuit, the fourth resistance element, and the fifth resistance element may be each set so that an idle current of the first transistor decreases as a temperature rises at temperatures above a predetermined temperature.

Note that, in an embodiment described below, the third temperature compensation circuit corresponds to a temperature compensation circuit 14, the series resistance element correspond to a resistance element R9 and a resistance element R10, the sixth transistor corresponds to a transistor Tr7, and the fifth resistance element corresponds to a resistance element R11.

It is preferable that all of the series resistance elements may be arranged in the same direction on a substrate.

It is preferable that a mode switching circuit, connected to the base terminal of the second transistor, operable to switch a bias current to be supplied to the second transistor to a predetermined value of the bias current may be further included. In this case, the mode switching circuit may include: a power supply circuit operable to control an output of a predetermined voltage to start or stop; a seventh transistor that has an emitter terminal connected to ground potential; a seventh resistance element that has one end connected to an output of the power supply circuit and has the other end connected to a base terminal of the seventh transistor; and an eighth resistance element that has one end connected to a collector terminal of the seventh transistor and has the other end connected to the base terminal of the second transistor.

Note that, in an embodiment described below, for example, the seventh transistor corresponds to a transistor Tr6, the seventh resistance element corresponds to a resistance element R7, and the eighth resistance element corresponds to a resistance element R8.

Based on the present invention, it is possible to provide a radio-frequency power amplifier having a bias circuit capable of making the temperature dependence, of the idle current of an amplifying transistor, lower than is conventionally the case and thus sufficiently compensating for temperature.

These and other objects, features, aspects and advantages of the present invention will become more apparent from the following detailed description of the present invention when taken in conjunction with the accompanying drawings.

DESCRIPTION OF THE PREFERRED EMBODIMENTS

With reference to the drawings, embodiments of a radio-frequency power amplifier of the present invention will be described below.

First Embodiment

Figure 1:
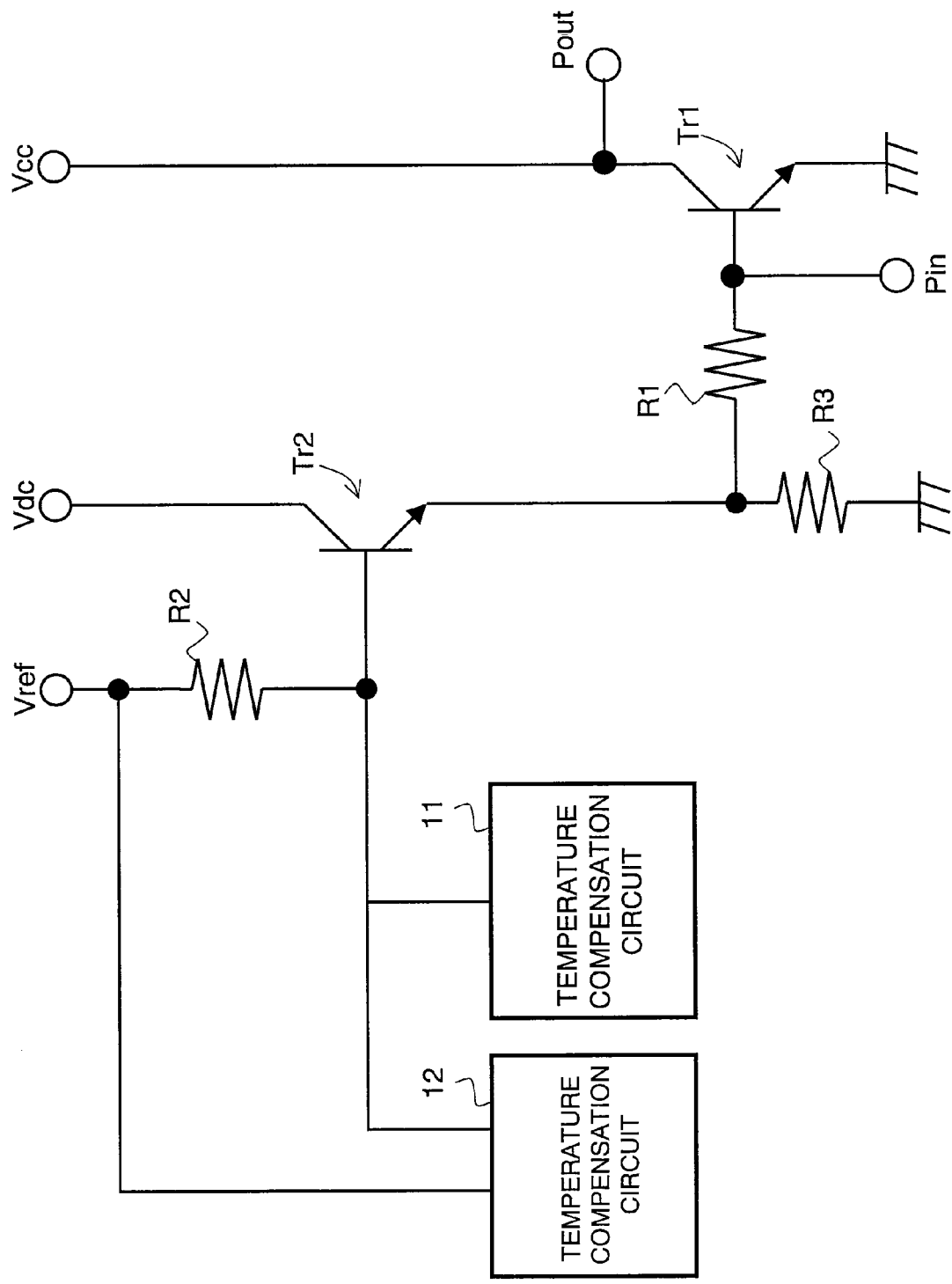
FIG. 1 is a diagram showing the circuit configuration of a radio-frequency power amplifier according to a first embodiment.

With reference to FIG. 1, the circuit configuration of a radio-frequency power amplifier according to a first embodiment of the present invention will be described. FIG. 1 is a diagram showing the circuit configuration of the radio-frequency power amplifier according to the first embodiment. The radio-frequency power amplifier of FIG. 1 includes an amplifying transistor Tr1 and a bias circuit. Note that, in FIG. 1, the same components as those of FIG. 9 will be denoted by the same numerals and therefore will not be described in detail.

The bias circuit, which supplies a bias current to the base terminal of the amplifying transistor Tr1, includes an emitter-follower transistor Tr2, resistance elements R1, R2 and R3, a temperature compensation circuit 11, and a temperature compensation circuit 12.

The temperature compensation circuit 11, which is connected to the base terminal of the emitter-follower transistor Tr2, compensates for the idle current of the amplifying transistor Tr1 in response to a temperature change by controlling the base potential of the emitter-follower transistor Tr2 so that the potential falls as the temperature rises.

The temperature compensation circuit 12, which is connected to the base terminal of the emitter-follower transistor Tr2 and also connected to a reference power supply Vref, compensates for the idle current of the amplifying transistor Tr1 in response to a temperature change by controlling the base potential of the emitter-follower transistor Tr2 so that the potential falls as the temperature rises.

Figure 2:
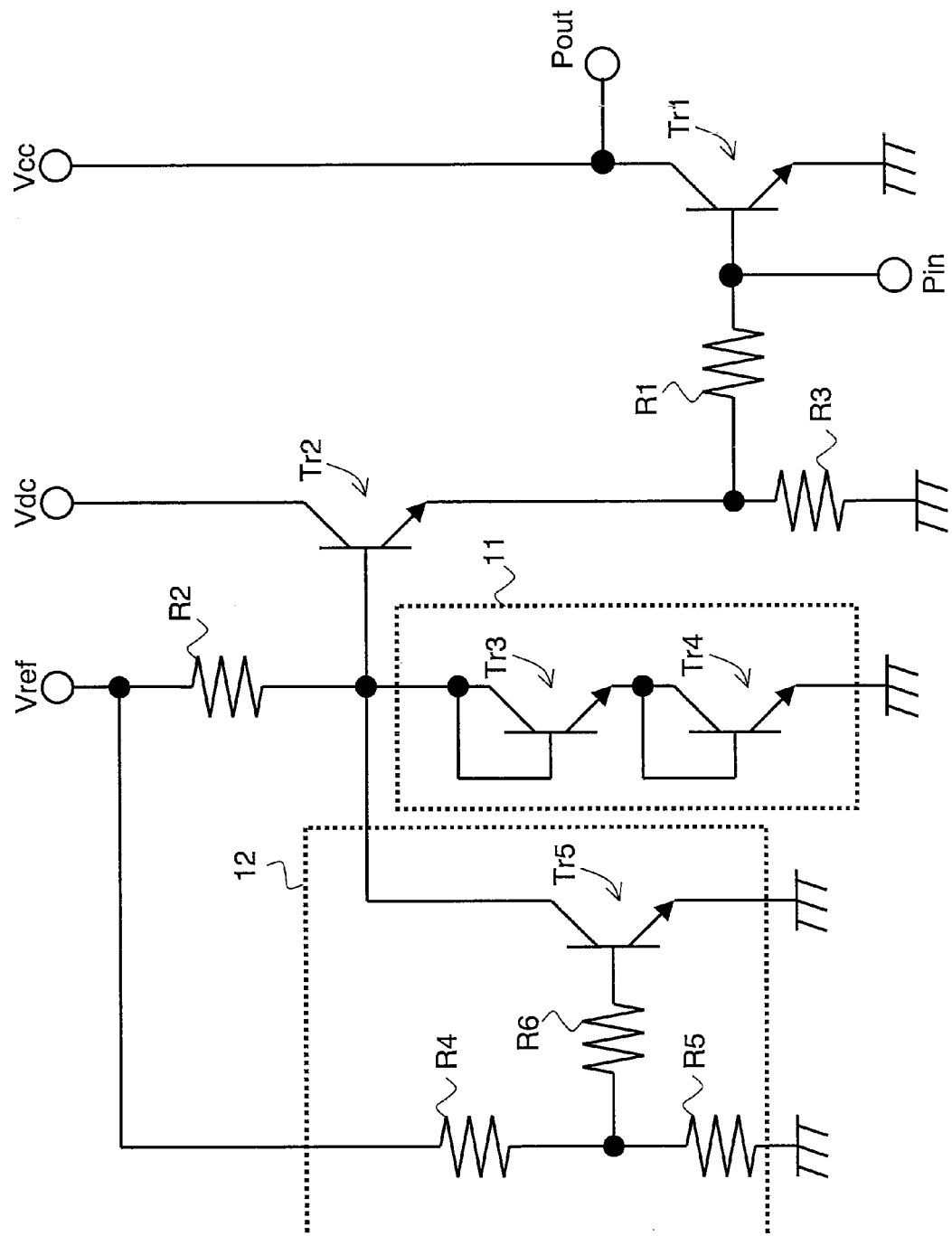
FIG. 2 is a diagram showing an example of specific circuit configurations of a temperature compensation circuit 11 and a temperature compensation circuit 12.

Next, specific circuit configurations of the temperature compensation circuits 11 and 12 will be described. FIG. 2 is a diagram showing an example of the specific circuit configurations of the temperature compensation circuits 11 and 12. The temperature compensation circuit 11, which is similar in configuration to the temperature compensation circuit 11 of FIG. 9, includes a diode transistor Tr3, the base terminal and collector terminal of which are short-circuited and a diode transistor Tr4, the base terminal and collector terminal of which are short-circuited. The diode transistors Tr3 and Tr4 are connected to each other as two stages in cascade. The emitter terminal of the diode transistor Tr4, which is the lower stage, is connected to ground potential. The collector terminal of the diode transistor Tr3, which is the upper stage, is connected to the base terminal of the emitter-follower transistor Tr2 and also connected to the reference power supply Vref via the resistance element R2.

The temperature compensation circuit 12 includes a transistor Tr5 and resistance elements R4, R5 and R6. The resistance elements R4 and R5 are connected to each other as two stages in cascade. The terminal, of the resistance element R4, not connected to the resistance element R5 is connected to the reference power supply Vref, and the terminal, of the resistance element R5, not connected to the resistance element R4 is connected to ground potential. Thus, the resistance elements R4 and R5 form a voltage divider circuit. The connecting point of the resistance elements R4 and R5 is connected to the base terminal of the transistor Tr5 via the resistance element R6. The emitter terminal of the transistor Tr5 is connected to ground potential. The collector terminal of the transistor Tr5 is connected to the base terminal of the emitter-follower transistor Tr2 and also connected to the reference power supply Vref via the resistance element R2.

Figure 3:
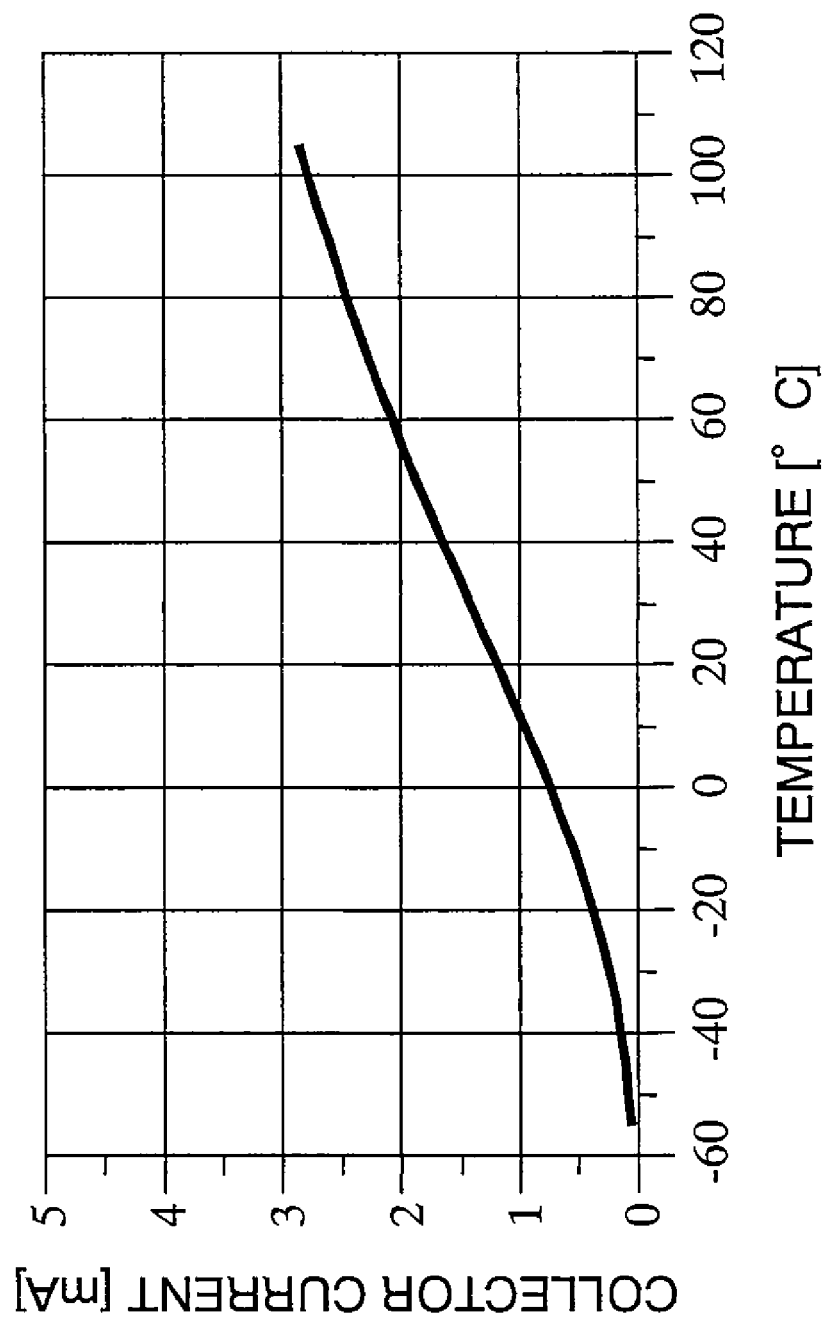
FIG. 3 is a diagram showing the temperature characteristics of the collector current of a transistor Tr5 of the temperature compensation circuit 12.
Figure 9:
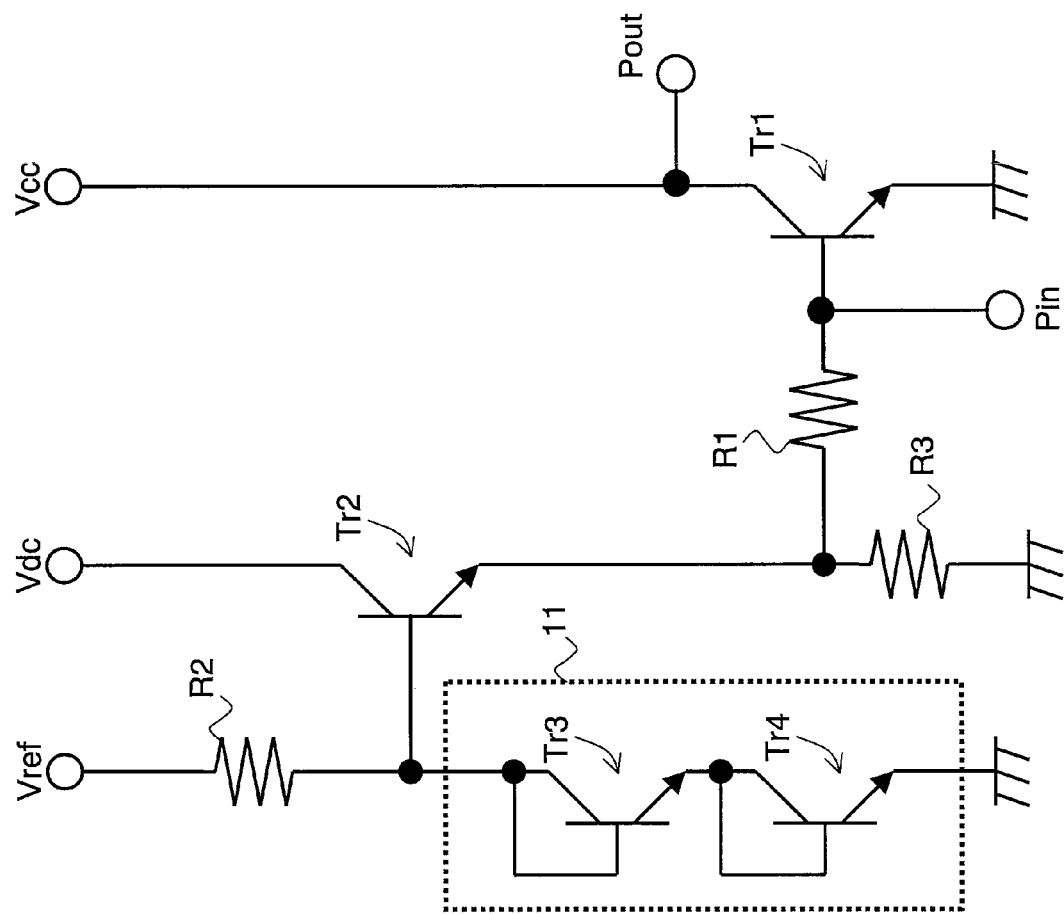
FIG. 9 is a diagram showing the circuit configuration of a radio-frequency power amplifier disclosed in Patent Document 2.

The operating principle of the temperature compensation circuit 11 is similar to that of the temperature compensation circuit 11 of FIG. 9, and therefore will not be described. The operating principle of the temperature compensation circuit 12 will be described below. FIG. 3 is a diagram showing the temperature characteristics of the collector current of the transistor Tr5 of the temperature compensation circuit 12. The resistance values of the resistance elements R4 and R5 are set so that the collector current flows through the transistor Tr5 even at the lowest temperature of the temperature conditions under which the radio-frequency power amplifier is used. The resistance value of the resistance element R6 is set so that the slope of the temperature characteristics of the collector current of the transistor Tr5 is an arbitrary slope. These settings of the resistance elements R4, R5, and R6 increase the collector current of the transistor Tr5 as the temperature rises from low to high, as shown in FIG. 3. Here, the collector terminal of the transistor Tr5 is connected to the base terminal of the emitter-follower transistor Tr2 and also connected to the reference power supply Vref via the resistance element R2. Since the collector current of the transistor Tr5 increases at high temperature as shown in FIG. 3, the voltage caused in the resistance element R2 increases further, and therefore the base potential of the emitter-follower transistor Tr2 falls further. At high temperature, this compensates for the idle current of the amplifying transistor Tr1 so that the value of the idle current decreases.

Figure 4B:
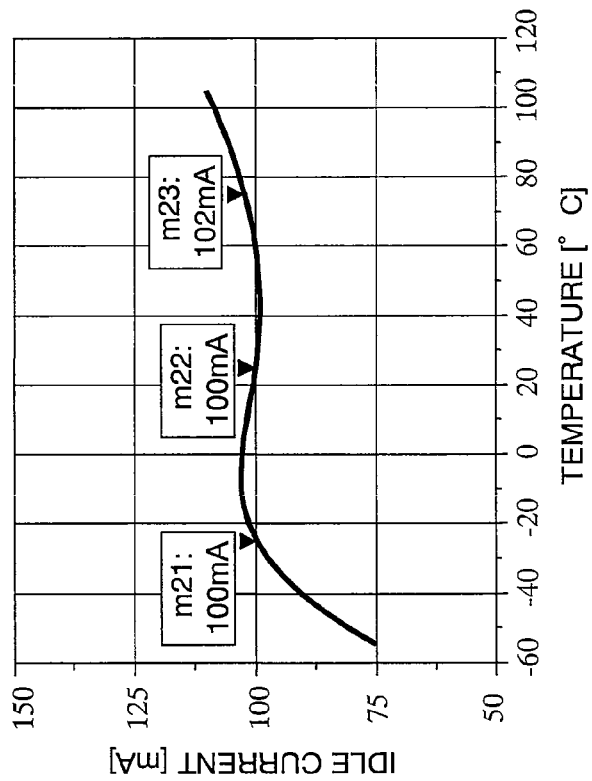
FIG. 4B is a diagram showing the temperature characteristics of the idle current of an amplifying transistor Tr1 of the radio-frequency power amplifier of the present invention, shown in FIG. 2.
Figure 4A:
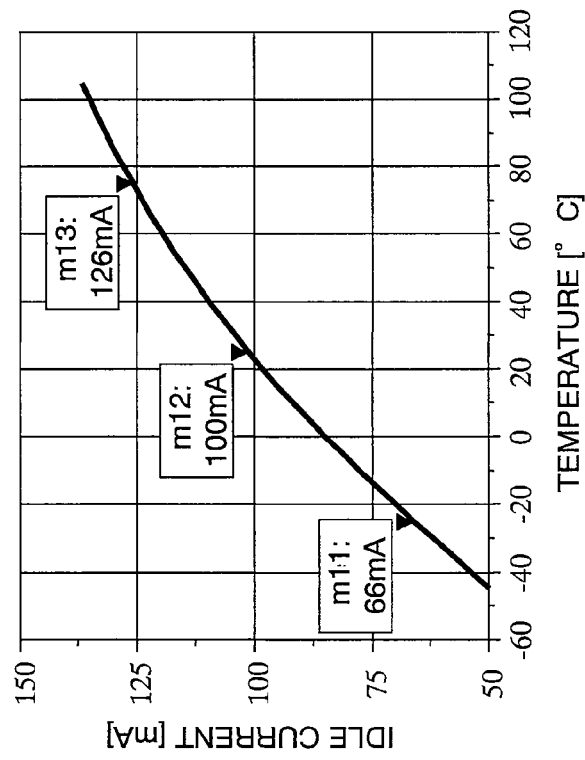
FIG. 4A is a diagram showing the temperature characteristics of the idle current of an amplifying transistor Tr1 of a conventional radio-frequency power amplifier, shown in FIG. 9.

FIG. 4A is a diagram showing the temperature characteristics of the idle current of the amplifying transistor Tr1 of the conventional radio-frequency power amplifier, shown in FIG. 9. The temperature characteristics of FIG. 4A indicate the characteristics when the value of each component of the bias circuit is set so that the idle current of the amplifying transistor Tr1 is 100 mA at an environmental temperature of 25° C., and also, the voltage value of the reference power supply Vref is set to 2.8 V, which is a control voltage used for a general mobile phone. Referring to FIG. 4A, m11 represents the idle current of the amplifying transistor Tr1 at an environmental temperature of −25° C., m12 represents the idle current of the amplifying transistor Tr1 at an environmental temperature of 25° C., and m13 represents the idle current of the amplifying transistor Tr1 at an environmental temperature of 75° C. As shown in FIG. 4A, since m11 is 66 mA and m13 is 126 mA, it is understood that the change of the current is approximately twofold at a temperature difference of 100° C. The reason is that the current consumed in the temperature compensation circuit 11 of FIG. 9 does not sufficiently increase as the temperature rises from low to high when the voltage value of the reference power supply Vref is set to 2.8 V.

FIG. 4B is a diagram showing the temperature characteristics of the idle current of the amplifying transistor Tr1 of the radio-frequency power amplifier of the present invention, shown in FIG. 2. Similarly to FIG. 4A, the temperature characteristics of FIG. 4B indicate the characteristics when the value of each component of the bias circuit is set so that the idle current of the amplifying transistor Tr1 is 100 mA at an environmental temperature of 25° C., and also, the voltage value of the reference power supply Vref is set to 2.8 V, which is a control voltage used for a general mobile phone. Referring to FIG. 4B, m21 represents the idle current of the amplifying transistor Tr1 at an environmental temperature of −25° C., m22 represents the idle current of the amplifying transistor Tr1 at an environmental temperature of 25° C., and m23 represents the idle current of the amplifying transistor Tr1 at an environmental temperature of 75° C. As shown in FIG. 4B, since m21 is 100 mA and m23 is 102 mA, it is understood that the change of the current at a temperature difference of 100° C. is suppressed to approximately 2 mA.

As described above, in the present embodiment, the bias circuit includes two temperature compensation circuits (the temperature compensation circuits 11 and 12). This makes it possible to make the temperature dependence, of the idle current of the amplifying transistor Tr1, lower than is conventionally the case. As a result, based on the present embodiment, it is possible to provide a radio-frequency power amplifier having a bias circuit capable of sufficiently compensating for temperature.

Further, the present embodiment includes the temperature compensation circuit 11, which is similar to that of FIG. 9. This makes it possible, unlike the configuration of FIG. 8, to smooth the base potential of the emitter-follower transistor Tr2 without using a large-size capacitor C1 besides the temperature compensation circuit, and therefore to supply a stable bias current.

Figure 8:
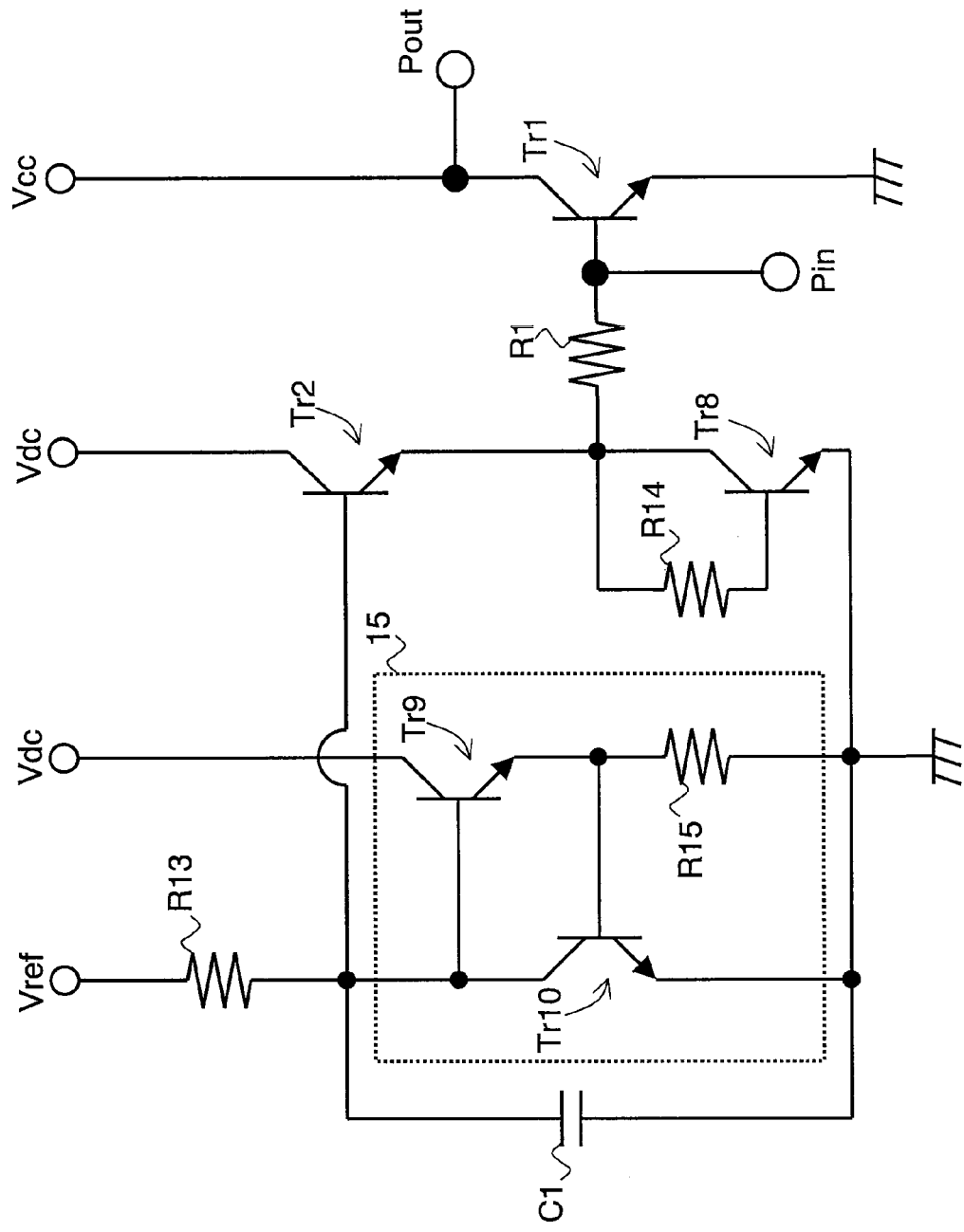
FIG. 8 is a diagram showing the circuit configuration of a radio-frequency power amplifier disclosed in Patent Document 1.

Furthermore, in the conventional temperature compensation circuit 15 of FIG. 8, since the transistors Tr9 and Tr10 form a current loop, noise may deteriorate and an oscillation may occur in the bias circuit. In the present embodiment, however, as shown in FIG. 2, the temperature compensation circuits 11 and 12 do not form a current loop. Thus, in the present embodiment, noise does not deteriorate nor does an oscillation occur in the bias circuit due to a current loop.

Note that the temperature compensation circuits 11 and 12 may not necessarily have the circuit configurations shown in FIG. 2, and may have other circuit configurations.

Note that the formation directions, on a substrate, of the resistance elements R4 and R5 of the temperature compensation circuit 12 are not particularly described above, but it is preferable that the formation directions of the resistance elements R4 and R5 be the same. A formation direction refers to the direction from one terminal of each resistance to the other. The same formation direction makes it possible to suppress production variations of the resistance values of the resistance elements R4 and R5, and therefore to obtain a desired potential at the connecting point of the resistance elements R4 and R5 with high accuracy. Note that, in the temperature compensation circuit 12, the voltage divider circuit is formed using two resistance elements (the resistance elements R4 and R5), but the voltage divider circuit may be formed by connecting three or more resistance elements in series.

Second Embodiment

Figure 5:
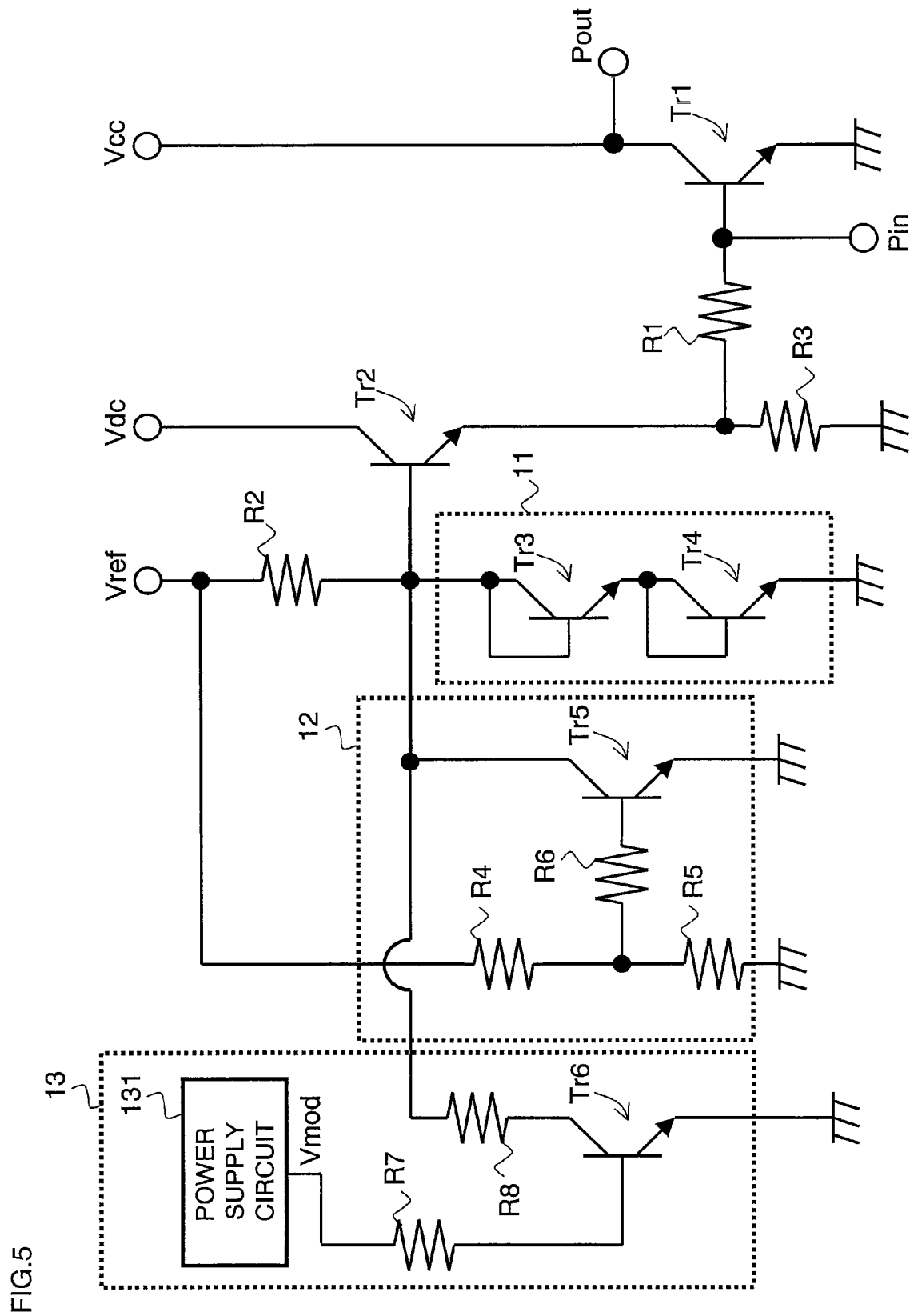
FIG. 5 is a diagram showing the circuit configuration of a radio-frequency power amplifier according to a second embodiment.

With reference to FIG. 5, the circuit configuration of a radio-frequency power amplifier according to a second embodiment of the present invention will be described. FIG. 5 is a diagram showing the circuit configuration of the radio-frequency power amplifier according to the second embodiment. The radio-frequency power amplifier of FIG. 5 is different from the radio-frequency power amplifier of FIG. 2 in that the radio-frequency power amplifier of FIG. 5 further includes a mode switching circuit 13. The other components of the circuit configuration of FIG. 5 are the same as those of the circuit configuration of FIG. 2, and therefore will be denoted by the same numerals and will not be described.

The mode switching circuit 13 includes a power supply circuit 131, a resistance element R7, a resistance element R8, and a transistor Tr6. The base terminal of the transistor Tr6 is connected to the output of the power supply circuit 131 via the resistance element R7. The collector terminal of the transistor Tr6 is connected to the base terminal of the emitter-follower transistor Tr2 via the resistance element R8 and also connected to the reference power supply Vref via the resistance elements R8 and R2. The emitter terminal of the transistor Tr6 is connected to ground potential. In accordance with a rule set in advance, the power supply circuit 131 controls the output of a mode switching voltage Vmod to start (i.e., the output is turned ON) or stop (i.e., the output is turned OFF).

The operating principle of the mode switching circuit 13 will be described. The output of the mode switching voltage Vmod is turned ON or OFF in accordance with a rule set in advance in the power supply circuit 131, whereby the transistor Tr6 operates as a switch (SW). When the output of the mode switching voltage Vmod is turned ON, the transistor Tr6 is turned ON, and therefore the collector current of the transistor Tr6 flows. When the collector current of the transistor Tr6 flows, the base potential of the emitter-follower transistor Tr2 falls, and therefore the collector current of the emitter-follower transistor Tr2 decreases. When the collector current decreases, the base potential of the amplifying transistor Tr1 falls, and therefore the idle current of the amplifying transistor Tr1 is suppressed so that the value of the idle current decreases.

As described above, in the present embodiment, the bias circuit includes the mode switching circuit 13. Here, it is assumed, for example, that the rule is set in the power supply circuit 131 so that, in the case where the dynamic range of the output power of the radio-frequency power amplifier is wide, the output of the mode switching voltage Vmod is turned ON at the time of a low output. In this case, it is possible to suppress the idle current of the amplifying transistor Tr1 at the time of a low output, and therefore to improve the power added efficiency of the radio-frequency power amplifier.

Note that the mode switching circuit 13 described above may not necessarily have the circuit configuration shown in FIG. 5, and may have another circuit configuration.

Third Embodiment

Figure 6:
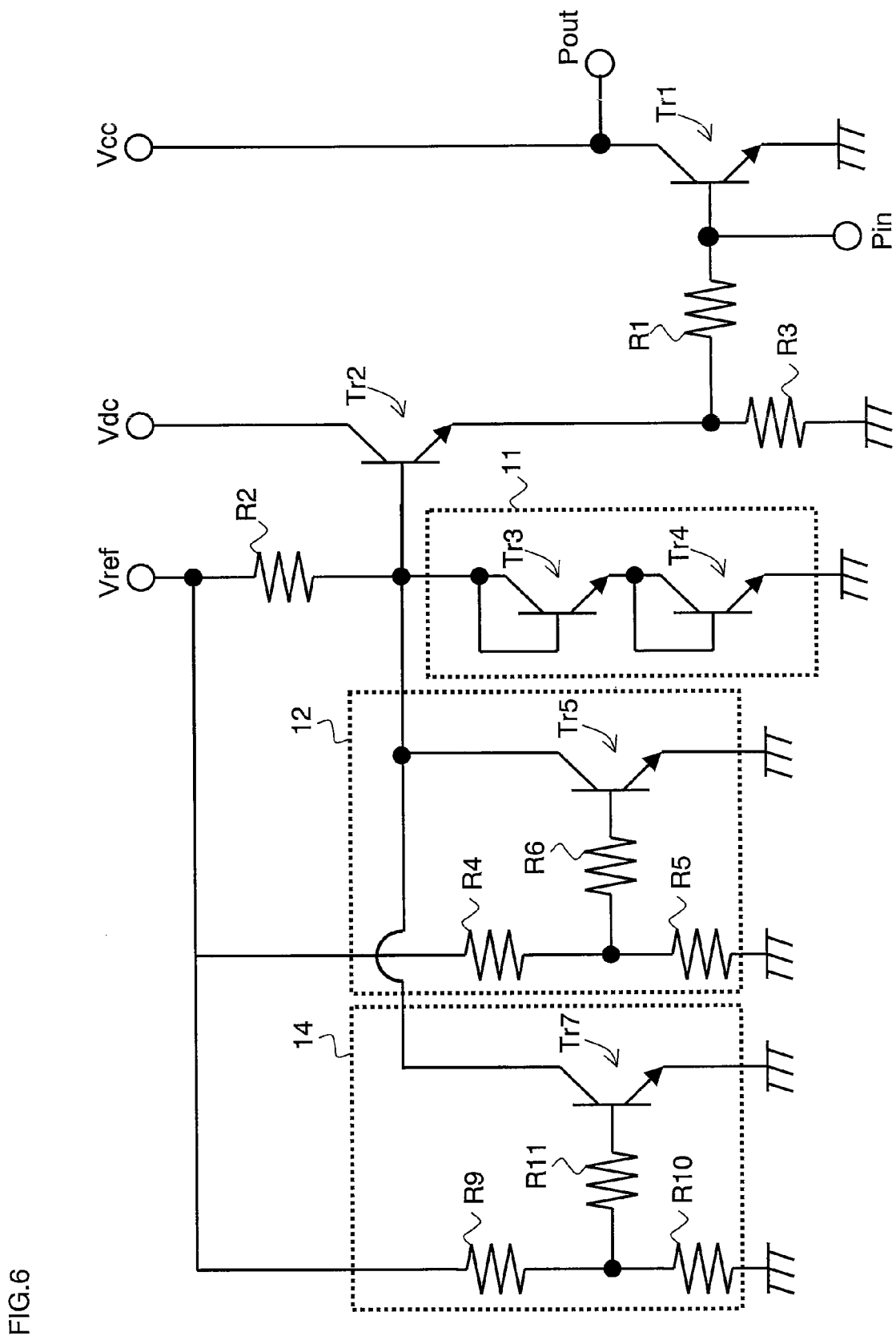
FIG. 6 is a diagram showing the circuit configuration of a radio-frequency power amplifier according to a third embodiment.

With reference to FIG. 6, the circuit configuration of a radio-frequency power amplifier according to a third embodiment of the present invention will be described. FIG. 6 is a diagram showing the circuit configuration of the radio-frequency power amplifier according to the third embodiment. The radio-frequency power amplifier of FIG. 6 is different from the radio-frequency power amplifier of FIG. 2 in that the radio-frequency power amplifier of FIG. 6 further includes a temperature compensation circuit 14. The other components of the circuit configuration of FIG. 6 are the same as those of the circuit configuration of FIG. 2, and therefore will be denoted by the same numerals and will not be described.

The temperature compensation circuit 14, which is similar in configuration to the temperature compensation circuit 12, is connected to the base terminal of the emitter-follower transistor Tr2 and thus the temperature compensation circuit 14, as well as the temperature compensation circuits 11 and 12, further compensates for temperature. More specifically, the temperature compensation circuit 14 includes a transistor Tr7 and resistance elements R9, R10 and R11. The resistance elements R9 and R10 are connected to each other as two stages in cascade. The terminal, of the resistance element R9, not connected to the resistance element R10 is connected to the reference power supply Vref, and the terminal, of the resistance element R10, not connected to the resistance element R9 is connected to ground potential. Thus, the resistance elements R9 and R10 form a voltage divider circuit. The connecting point of the resistance elements R9 and R10 is connected to the base terminal of the transistor Tr7 via the resistance element R11. The emitter terminal of the transistor Tr7 is connected to ground potential. The collector terminal of the transistor Tr7 is connected to the base terminal of the emitter-follower transistor Tr2 and also connected to the reference power supply Vref via the resistance element R2. Note that the operating principle of the temperature compensation circuit 14 is similar to that of the temperature compensation circuit 12, and therefore will not be described.

Here, the resistance values of the resistance elements R4, R5, and R6 of the temperature compensation circuit 12 and the resistance values of the resistance elements R9, R10, and R11 of the temperature compensation circuit 14 are set to different values from each other, whereby the temperature characteristics of the idle current of the amplifying transistor Tr1 can have an inflection point. Consequently, the temperature characteristics of the idle current of the amplifying transistor Tr1 may have such an inflection point that, for example, the idle current decreases only as the temperature rises at temperatures above a desired temperature. Due to this inflection point, the idle current of the amplifying transistor Tr1 decreases at high temperature even when the idle current is high at low temperature, and therefore it is possible to suppress thermal runaway of the idle current of the amplifying transistor Tr1 at high temperature.

Note that the circuit configuration of the temperature compensation circuit 14 may not necessarily be the same as that of the temperature compensation circuit 12 as described above, and the temperature compensation circuit 14 may have another circuit configuration. Additionally, in the present embodiment, the mode switching circuit 13 of the second embodiment may be further provided.

Fourth Embodiment

Figure 7:
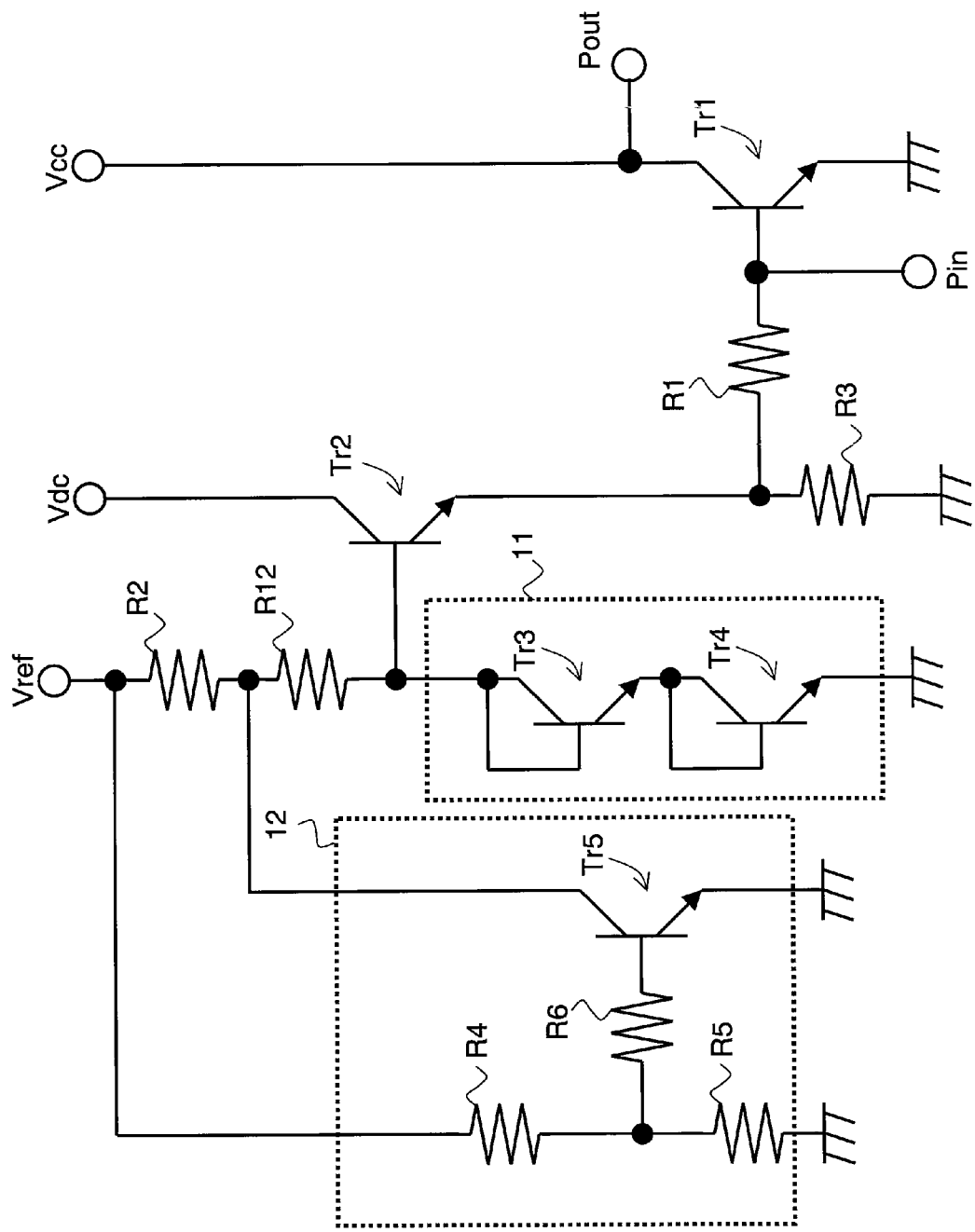
FIG. 7 is a diagram showing the circuit configuration of a radio-frequency power amplifier according to a fourth embodiment.

With reference to FIG. 7, the circuit configuration of a radio-frequency power amplifier according to a fourth embodiment of the present invention will be described. FIG. 7 is a diagram showing the circuit configuration of the radio-frequency power amplifier according to the fourth embodiment. The radio-frequency power amplifier of FIG. 7 is different from the radio-frequency power amplifier of FIG. 2 in that the radio-frequency power amplifier of FIG. 7 further includes a resistance element R12. The other components of the circuit configuration of FIG. 7 are the same as those of the circuit configuration of FIG. 2, and therefore will be denoted by the same numerals and will not be described.

The resistance element R12 is provided between the resistance element R2 and the connecting point of the base terminal of the emitter-follower transistor Tr2 and the collector terminal of the diode transistor Tr3.

Here, the use of the amplifying transistor Tr1 that has a small emitter area decreases the bias current flowing between the base and emitter of the amplifying transistor Tr1, compared to the use of the amplifying transistor Tr1 that has a large emitter area, and therefore the base-emitter current of the emitter-follower transistor Tr2 decreases.

In the configuration shown in FIG. 2, only the resistance element R2 is provided between the reference power supply Vref and the base terminal of the emitter-follower transistor Tr2. As a result, the use of the amplifying transistor Tr1 that has a small emitter area decreases the voltage caused in the resistance element R2 and raises the base potential of the emitter-follower transistor Tr2. To suppress this rise, it is necessary to increase the resistance value of the resistance element R2. However, since the collector current of the transistor Tr5 of the temperature compensation circuit 12 significantly increases at high temperature, if the resistance value of the resistance element R2 is increased, the base potential of the emitter-follower transistor Tr2 may significantly fall, and therefore the amplifying transistor Tr1 may be turned OFF at high temperature. To prevent this, it may be possible to decrease the collector current of the transistor Tr5 by increasing the resistance value of the resistance element R6 of the temperature compensation circuit 12, but it is necessary to increase the area of the resistance element R6.

In contrast, in the configuration of the present embodiment, shown in FIG. 7, the resistance elements R2 and R12 are provided between the reference power supply Vref and the base terminal of the emitter-follower transistor Tr2. Additionally, the collector current of the transistor Tr5 of the temperature compensation circuit 12 does not flow through the resistance element R12. That is, in the configuration of the present embodiment, the resistance value between the reference power supply Vref and the base terminal of the emitter-follower transistor Tr2 is increased using the resistance element R12 that is not involved in the collector current of the transistor Tr5 of the temperature compensation circuit 12. Consequently, the configuration of the present embodiment can suppress the rise of the base potential of the emitter-follower transistor Tr2 without increasing the resistance value of the resistance element R2. Further, since the resistance value of the resistance element R2 is not increased, the base potential of the emitter-follower transistor Tr2 does not significantly rise at high temperature even when the collector current of the transistor Tr5 of the temperature compensation circuit 12 increases at high temperature. Therefore, it is possible to prevent the amplifying transistor Tr1 from being turned OFF at high temperature.

As described above, in the present embodiment, the resistance elements R2 and R12 are provided between the reference power supply Vref and the base terminal of the emitter-follower transistor Tr2. Consequently, in the configuration of the present embodiment, the use of the amplifying transistor Tr1 that has a small emitter area makes it possible to suppress the rise of the base potential of the emitter-follower transistor Tr2 without increasing the size of the resistance element R2, and also possible to prevent the amplifying transistor Tr1 from being turned OFF at high temperature without increasing the area of the resistance element R6.

Note that, in FIG. 7, the reference power supply Vref is connected to the resistance elements R2 and R12 that are connected to each other in series, but may be connected to three or more series resistance elements connected in series. In this case, the collector terminal of the transistor Tr5 of the temperature compensation circuit 12 may be connected to the reference power supply Vref via one or more series resistance elements and also connected to the base terminal of the emitter-follower transistor Tr2 via one or more series resistance elements. Alternatively, when a plurality of temperature compensation circuits 12 are provided, the collector terminals of the transistors Tr5 of the temperature compensation circuits 12 may be connected to the same connecting point or different connecting points between series resistance elements.

Note that, in the present embodiment, the mode switching circuit 13 of the second embodiment may be further provided. In this case, the collector terminal of the transistor Tr6 of the mode switching circuit 13 may be connected to the reference power supply Vref via the resistance element R8 and one or more series resistance elements and also connected to the base terminal of the emitter-follower transistor Tr2 via the resistance element R8 and one or more series resistance elements.

While the invention has been described in detail, the foregoing description is in all aspects illustrative and not restrictive. It is understood that numerous other modifications and variations can be devised without departing from the scope of the invention.

What is claimed is:

1. A radio-frequency power amplifier comprising:
 a first transistor operable to amplify a power of a radio-frequency signal; and
 a bias circuit operable to supply a bias current to the first transistor;
 the bias circuit including:
  a second transistor that has a collector terminal connected to a first power supply;
  a first resistance element that has one end connected to an emitter terminal of the second transistor and has the other end connected to a base terminal of the first transistor;
  a second resistance element that has one end connected to the emitter terminal of the second transistor and has the other end connected to ground potential;
  at least one third resistance element provided between a base terminal of the second transistor and a second power supply; and
  a plurality of temperature compensation circuits connected to the base terminal of the second transistor and operable to control a base potential of the second transistor so that the potential falls as a temperature rises, at least one of the plurality of temperature compensation circuits being unlike all the rest of the plurality of temperature compensation circuits in configuration.

2. The radio-frequency power amplifier according to claim 1,
 wherein the bias circuit includes a first temperature compensation circuit and a second temperature compensation circuit,
 wherein the first temperature compensation circuit includes:
  a third transistor that has a collector terminal and a base terminal that are short-circuited, the collector terminal being connected to the base terminal of the second transistor; and
  a fourth transistor that has a collector terminal and a base terminal that are short-circuited, the collector terminal being connected to an emitter terminal of the third transistor, and has an emitter terminal connected to ground potential, and
 wherein the second temperature compensation circuit includes:
  a first voltage divider circuit having a plurality of series resistance elements connected in series;
  a fifth transistor that has a collector terminal connected to the base terminal of the second transistor and an emitter terminal connected to ground potential; and
  a fourth resistance element that has one end connected to a connecting point of any of the series resistance elements of the first voltage divider circuit and has the other end connected to a base terminal of the fifth transistor.

3. The radio-frequency power amplifier according to claim 2,
 wherein the bias circuit further includes at least one sixth resistance element provided between the base terminal of the second transistor and a connecting point of the third resistance element and the collector terminal of the fifth transistor.

4. The radio-frequency power amplifier according to claim 2,
 wherein the bias circuit further includes a third temperature compensation circuit,
 wherein the third temperature compensation circuit includes:
  a second voltage divider circuit having a plurality of series resistance elements connected in series;
  a sixth transistor that has a collector terminal connected to the base terminal of the second transistor and has an emitter terminal connected to ground potential; and
  a fifth resistance element that has one end connected to a connecting point of any of the series resistance elements of the second voltage divider circuit and has the other end connected to a base terminal of the sixth transistor, and
 wherein resistance values of the series resistance elements of the first voltage divider circuit, the series resistance elements of the second voltage divider circuit, the fourth resistance element, and the fifth resistance element are each set so that an idle current of the first transistor decreases as a temperature rises at temperatures above a predetermined temperature.

5. The radio-frequency power amplifier according to any one of claims 2 through 4,
 wherein all of the series resistance elements are arranged in the same direction on a substrate.

6. The radio-frequency power amplifier according to claim 1, further comprising:
 a mode switching circuit, connected to the base terminal of the second transistor, operable to switch a bias current to be supplied to the second transistor to a predetermined value of the bias current.

7. The radio-frequency power amplifier according to claim 6,
 wherein the mode switching circuit includes:
  a power supply circuit operable to control an output of a predetermined voltage to start or stop;
  a seventh transistor that has an emitter terminal connected to ground potential;
  a seventh resistance element that has one end connected to an output of the power supply circuit and has the other end connected to a base terminal of the seventh transistor; and
  an eighth resistance element that has one end connected to a collector terminal of the seventh transistor and has the other end connected to the base terminal of the second transistor.

* * * * *